(12) United States Patent
Muthukumar et al.

(10) Patent No.: US 7,294,525 B2
(45) Date of Patent: Nov. 13, 2007

(54) HIGH PERFORMANCE INTEGRATED INDUCTOR

(75) Inventors: Sriram Muthukumar, Chandler, AZ (US); Jianggi He, Gilbert, AZ (US); Thomas S. Dory, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 232 days.

(21) Appl. No.: 11/137,974

(22) Filed: May 25, 2005

(65) Prior Publication Data

US 2006/0270065 A1 Nov. 30, 2006

(51) Int. Cl.
*H01L 21/00* (2006.01)
(52) U.S. Cl. .................................... 438/73; 257/531
(58) Field of Classification Search ............... 438/3, 438/73, 128, 611; 257/531, E21.022, E31.083
See application file for complete search history.

(56) References Cited

U.S. PATENT DOCUMENTS 6,815,220 B2 * 11/2004 Crawford et al. ............. 438/3

OTHER PUBLICATIONS

O'Donnell et al., "Mictotransformers and Inductors using Permalloy Thin Films", PEI Technologies, Ireland. (retrieved from WWW May 25, 2005) 8 pages http://www.eimw.tuwien.ac.at/publication/workshop0600/ODonnell.html.
Chomnawang et al, "Surface micromachined arch-shape on-chip 3-D solenoid inductors for high-frequency applications", JM vol. 2 No. 4, Oct. 2003, pp. 275-281.
Chomnawang et al, "On-chip dome-shape spiral micro-inductor for high-frequency applications", Proceedings of SPIE vol. 4700, 2002, pp. 50-57.
Chomnawang et al, "On-chip 3D air core micro-inductor for high-frequency applications using deformation of sacrificial polymer", Proceedings of SPIE vol. 4334, 2001.
Chomnawang et al, "Micromachined on-chip 3D inductors", 4 pages; unknown date.
Crawford et al, "High-Frequency Microinductors with Aorphous Magnetic Ground Planes", IEEE Transactions on Magnetics, vol. 38, No. 5 Sep. 2002.
Gardner et al, "High Frequency (GHz) and Low Resistance Integrated Inductors Using Magnetic Materials", IEEE 0-7803-6678, 2001 pp. 101-103.

* cited by examiner

*Primary Examiner*—David Vu
(74) *Attorney, Agent, or Firm*—David L. Guglielmi

(57) ABSTRACT

Some embodiments of the present invention include providing high performance integrated inductors.

21 Claims, 23 Drawing Sheets

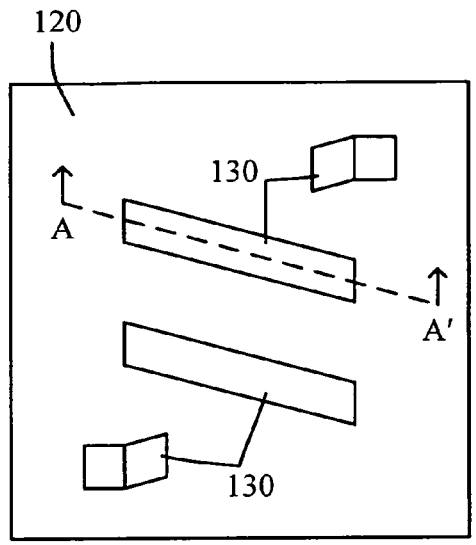
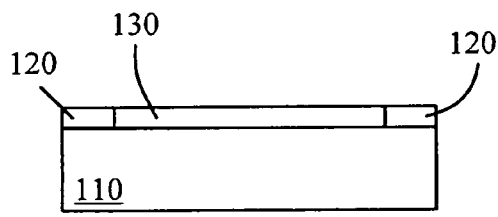
FIG. 3    FIG. 3A
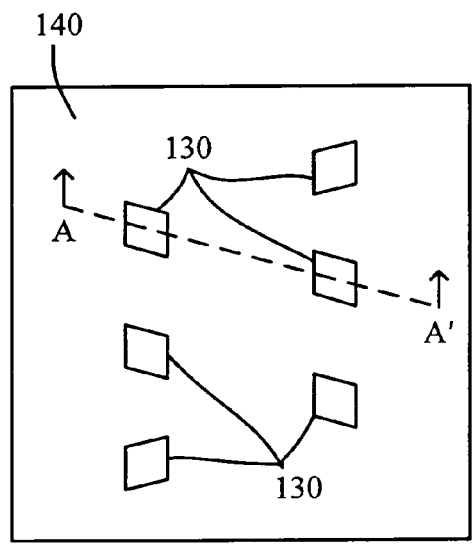
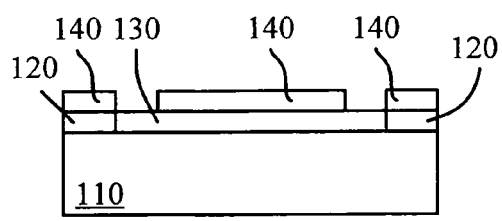
FIG. 4    FIG. 4A

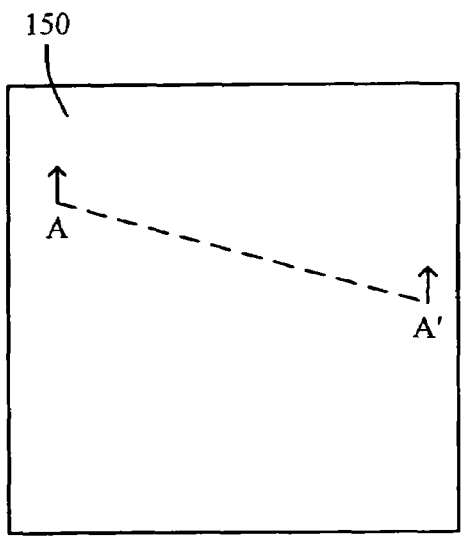
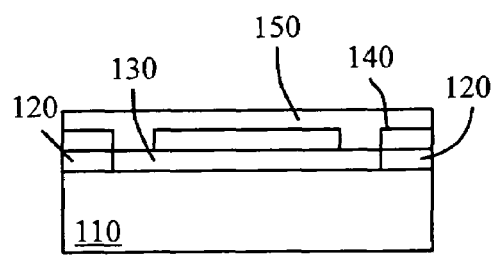
FIG. 5  FIG. 5A
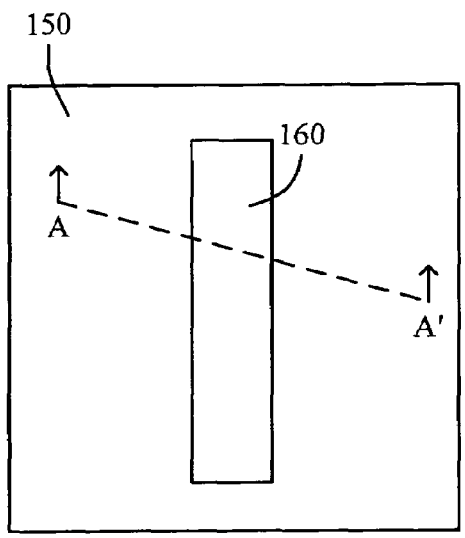
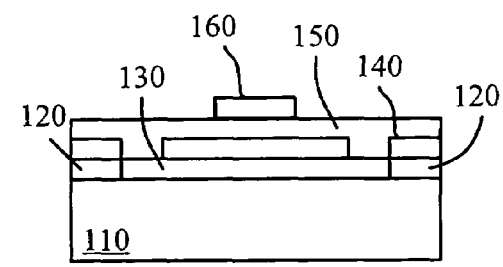
FIG. 6  FIG. 6A

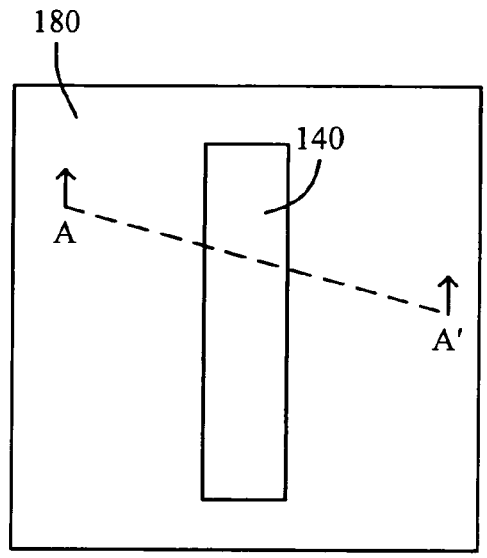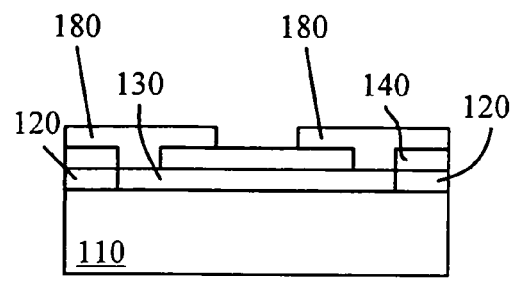
FIG. 8    FIG. 8A
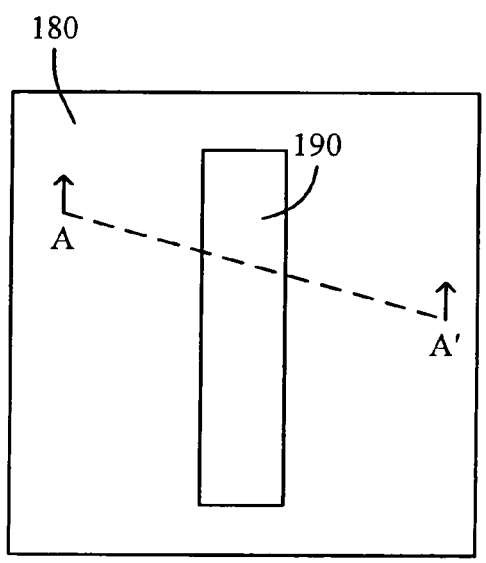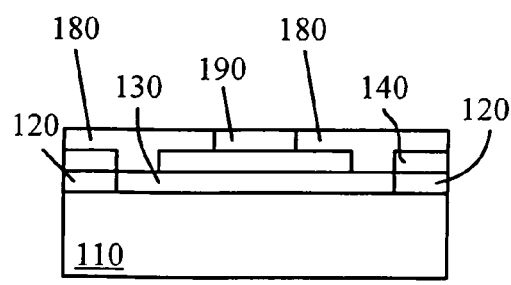
FIG. 9    FIG. 9A

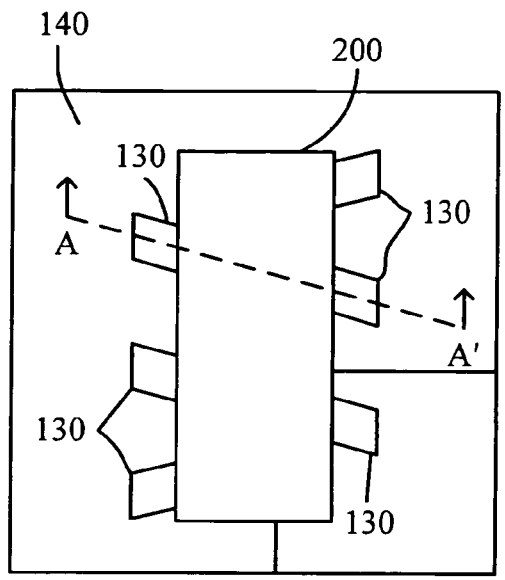 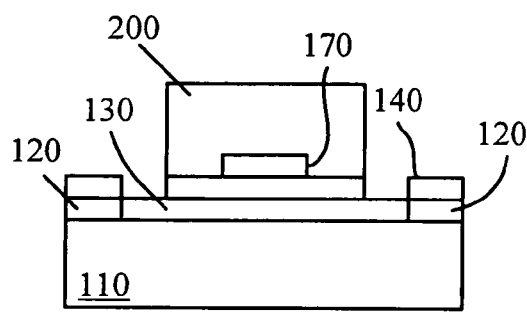
FIG. 11        FIG. 11A
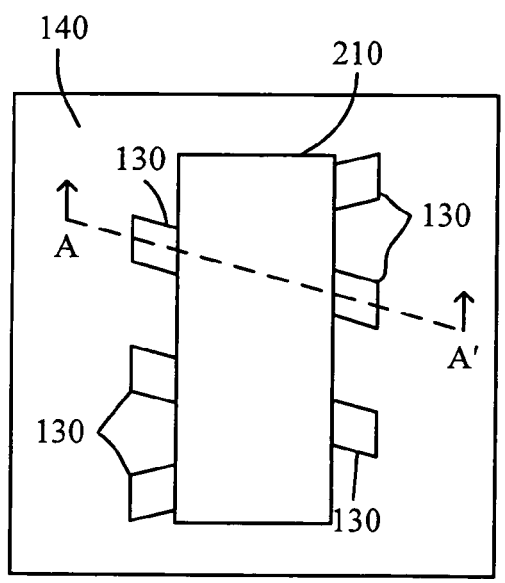 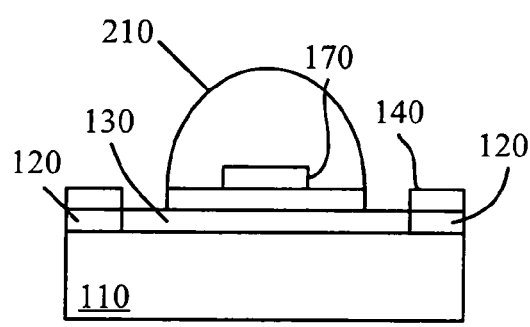
FIG. 12        FIG. 12A

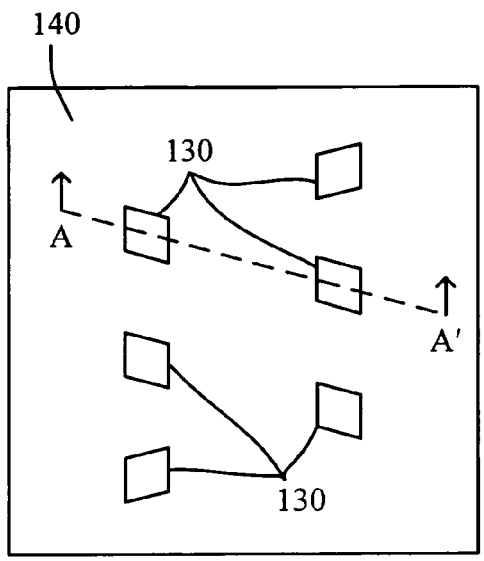
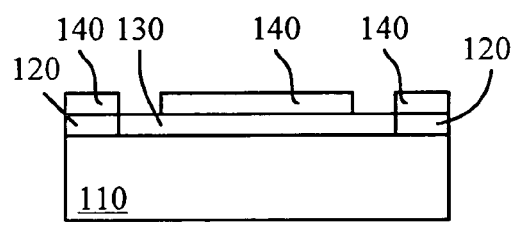
FIG. 18  FIG. 18A
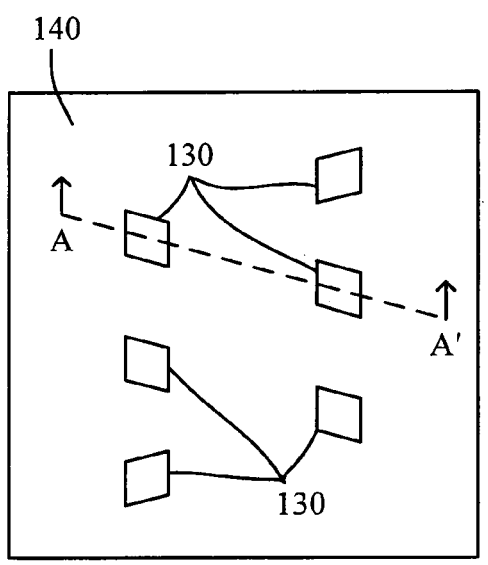
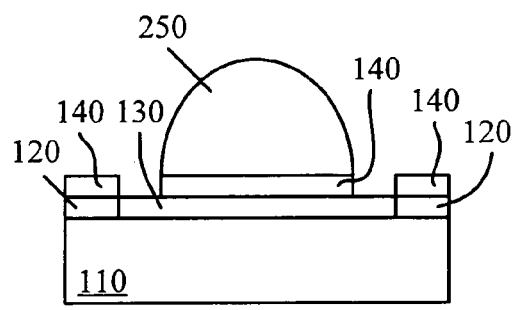
FIG. 19  FIG. 19A

HIGH PERFORMANCE INTEGRATED INDUCTOR

TECHNICAL FIELD

Embodiments of the invention relate to semiconductor packaging. In particular, embodiments of the invention relate to methods and apparatus for high performance and small form factor integrated inductor fabrication.

BACKGROUND

In semiconductor packaging, an integrated circuit (IC) may be placed on a package. Discrete inductors may be placed next to the die on the package and electrically connected to the IC. Inductors may provide various functions, such as, for example, energy storage, selective filtering, and noise reduction. In general, the performance of an inductor may improve with increased inductance (L), increased Q factor (inductor reactance over resistance), and reduced resistance (R).

BRIEF DESCRIPTION OF THE DRAWINGS

The invention is illustrated by way of example and not by way of limitation in the figures of the accompanying drawings, in which the like references indicate similar elements and in which:

FIGS. 3-28, 3A-28A, and 14B-17B, 21B-28B illustrate top down type views and cross sectional type views of various methods in accordance with embodiments of the present invention.

DETAILED DESCRIPTION

In various embodiments, an apparatus and method relating to integrated inductors are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn. However, the order of description should not be construed as to imply that these operations are necessarily order dependent. In particular, these operations need not be performed in the order of presentation.

Inductor performance may be enhanced by increasing the inductance (L) and Q factor of the inductor, and by reducing the resistance (R) of the inductor. Generally, inductor performance, and particularly L and Q, may be enhanced by providing a magnetic core in the inductor. Further, integrated inductors having small form factors may be used in many packaging applications. In particular, providing a 3-dimensional generally spiral shaped inductor including a magnetic core may enhance the performance of current integrated inductors. Also, a 3-dimensional generally spiral shaped inductor including a magnetic core may provide similar or increased performance over discrete inductors while providing many advantages due to their small form factors.

Figure 1:
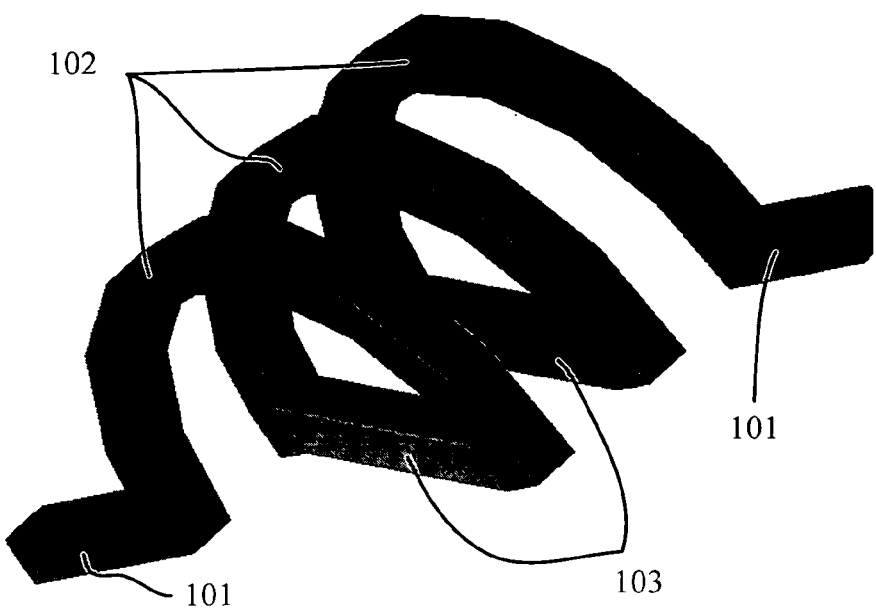
FIG. 1 illustrates a three dimensional type view of an apparatus in accordance with one embodiment of the present invention.

FIG. 1 illustrates an inductor 100 having connections 101, segments 103, and elements 102. A magnetic core may run through the middle of inductor 100, between segments 103 and elements 102, as is further discussed below. In addition, inductor 100 may be on a substrate, as is further discussed below. However, neither a magnetic core nor a substrate are shown in FIG. 1 for the sake of clarity.

Elements 102 are illustrated as arcs in FIG. 1. However, any suitable shape may be used. As will be further discussed below, elements 102 may be formed using any available support shape, such as a dome or a column. Therefore, elements 102 may be of any shape that facilitates connection to the ends of segments 103 and allows a magnetic material to run between elements 102 and segments 103. In an embodiment, segments 103 may be in the shape of an arc. In another embodiment, segments 103 may be in the shape of an arch having a squared off bottom and a rounded top. In another embodiment, segments 103 may be in the shape of an arch having a rounded bottom and a squared off top. Several other shapes, such as, for example, an arch having an oval bottom and top, may be available.

As illustrated in FIG. 1, segments 103 may generally be segments that are aligned in rows. However, the only restraint on the layout of segments 103 is that they may be able to form the generally spiral shape of inductor 100. Specifically, segments 103 need not be the same length, nor do segments 103 need to be parallel. Further, as is illustrated in FIG. 1, elements 102 may generally connect opposite ends of adjacent segments 103 to form the spiral shape of inductor 100.

FIG. 1 illustrates connections 101 connecting to ends of elements 102 and extending away from inductor 100. However, connections 101 may connect to inductor 100 in any way. In an embodiment, connections 100 may connect to segments 103. In another embodiment, elements 102 may connect to shorter segments (not shown) that are similar to segments 103, but only extend to a center line of inductor 100. In other embodiments, connections 100 may extend away from inductor 100 along a line extending along the center line of inductor 100.

FIG. 1 illustrates inductor 100 having 3 turns; however, any number of turns may be used. In an embodiment, inductor 100 may have 5 turns. In another embodiment, inductor 100 may have 10 turns. In other embodiments, inductor 100 may have any of 1 to 20 turns.

Inductor 100 illustrated in FIG. 1 may have any dimensions. In some embodiments, the width of inductor 100 may be in the range of about 100 to 200 microns. In an embodiment, the width may be in the range of about 100 to 160 microns. In another embodiment, the width may be in the range of about 140 to 160 microns. In some embodiments, the height of inductor 100 may be in the range of about 40 to 100 microns. In an embodiment, the height of inductor 100 may be in the range of about 40 to 80 microns. In another embodiment, the height may be in the range of about 60 to 80 microns. The length of inductor 100 may vary according to the number of turns. In an embodiment, the pitch between turns in inductor 100 may be in the range of about 50 to 130 microns. In another embodiment, the pitch between turns in inductor 100 may be in the range of about 50 to 100 microns. In an embodiment, the pitch between turns in inductor 100 may be in the range of about 80 to 100 microns.

Elements 102 and segments 103 may include any suitable material. In an embodiment, elements 102 and segments 103 may be conductive. In some embodiments, elements 102 and segments 103 may be plated copper. In an embodiment, elements 102 and segments 103 may include aluminum. In another embodiment, elements 102 and segments 103 may include gold.

Inductor 100 may have any performance characteristics. The performance characteristics of inductor 100 may generally depend on a wide number of factors, such as the number of turns, the materials, sizes and shapes of elements 102, segments 103, and the magnetic core, and the X-Y-Z dimensions of inductor 100.

Figure 2:
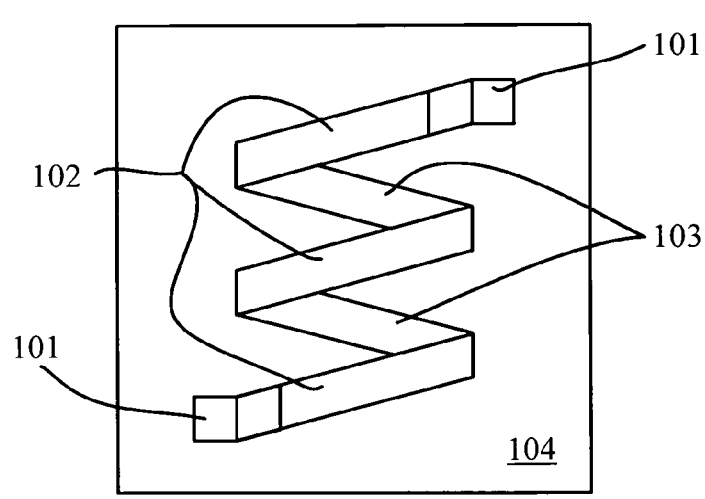
FIG. 2 illustrates a top down type view of an apparatus in accordance with one embodiment of the present invention.

FIG. 2 illustrates a top down view of inductor 100 on substrate 104. A magnetic core may run through the middle of inductor 100, between segments 103 and elements 102, however a magnetic core is not shown in FIG. 2 for the sake of clarity. Inductor 100 on substrate 104 may be considered an integrated inductor because it is integrated onto substrate 104, as is further described below. Connections 101 may connect inductor 100 to various other integrated circuits and devices, such as transistors, resistors, capacitors, and the like. For the sake of clarity, only a portion of substrate 104 may be illustrated.

FIGS. 3 through 28 illustrate various embodiments of methods for forming an integrated inductor including a magnetic core. Here, and throughout this description, reference to a figure also includes reference to any figure illustrating a corresponding cross-sectional view. For example, reference to FIG. 16 also includes reference to FIGS. 16A and 16B.

FIG. 3 illustrates a top down view and FIG. 3A illustrates a cross-sectional view taken between points A and A'. FIGS. 3 and 3A illustrate a pattern 130 and layer 120 on substrate 110. Pattern 130 and layer 120 may be formed in any available manner. Pattern 130 may be any conductive material. In some embodiments, pattern 130 may include a metal. In an embodiment, pattern 130 may include copper. In another embodiment pattern 130 may include aluminum. In an embodiment, pattern 130 may be plated with copper. Pattern 130 may include segments that may be the bottom portions of an inductor. Pattern 130 may also include other segments that may be connections for connecting an inductor to other electrical circuitry.

Layer 120 may be any suitable material. In some embodiments, layer 120 may include the same material as substrate 110. In other embodiments, layer 120 may include dielectric materials.

Substrate 110 may be any suitable material. In an embodiment, substrate 100 may include monocrystalline silicon. In another embodiment, substrate 100 may include silicon on insulator. Substrate 100 may also include other layers or structures (not shown) that comprise insulative, conductive, or semiconductive materials, such as sources, drains, wells, gate dielectrics, isolation structures, and others.

As illustrated in top down view in FIG. 4 and in cross-section in FIG. 4A, a separation layer 140 may be formed over pattern 130 and layer 120. In an embodiment, separation layer 140 may include a photoresist or polyimide material. In an embodiment, separation layer 140 may be formed by spinning on the photoresist or polyimide, selectively exposing it to radiation, and developing away exposed (or unexposed) regions, as is known in the art. In some embodiments, the formation of separation layer 140 may also include a hard bake or a cure. In an embodiment, separation layer 140 may include a pattern having portions that cover parts of segments of pattern 130 while exposing the ends of segments of pattern 130, as is illustrated in FIG. 4. In an embodiment, separation layer 140 may cover portions of pattern 130 that provide connections for an inductor.

FIGS. 5-7 and FIGS. 8-10 (including cross-sectional views), may illustrate separate methods for forming a magnetic core over separation layer 140. It should be pointed out that FIGS. 7 and 10 may be substantially the same.

As illustrated in FIGS. 5 and 5A, a magnetic material 150 may be formed over layer 120, pattern 130, and separation layer 140. Magnetic material 150 may be formed by known techniques, such as deposition, sputtering, and plating. Magnetic material 150 may include any suitable material. In some embodiments, magnetic material 150 may include permalloys. In other embodiments, magnetic material 150 may include NiFe, FeTaN, or NiFeRe. In an embodiment, magnetic material 150 may include CoZrTa.

The thickness of magnetic material 150 illustrated in FIGS. 5 and 5A may be any desired thickness. In some embodiments, the thickness of magnetic material 150 may be chosen based on a desired magnetic permeability of magnetic material 150. In an embodiment, the thickness may be in the range of about 0.25 to 10 microns. In another embodiment, the thickness may be in the range of about 0.25 to 5 microns. In another embodiment, the thickness may be it the range of about 0.5 to 2 microns.

As illustrated in FIGS. 6 and 6A, a patterned layer 160 may be formed over magnetic material 150 by known techniques such as spin-on, exposure, and develop. Patterned layer 160 may cover portions of magnetic material 150 while leaving other portions exposed. In an embodiment, patterned layer 160 may include a resist.

Figure 7:
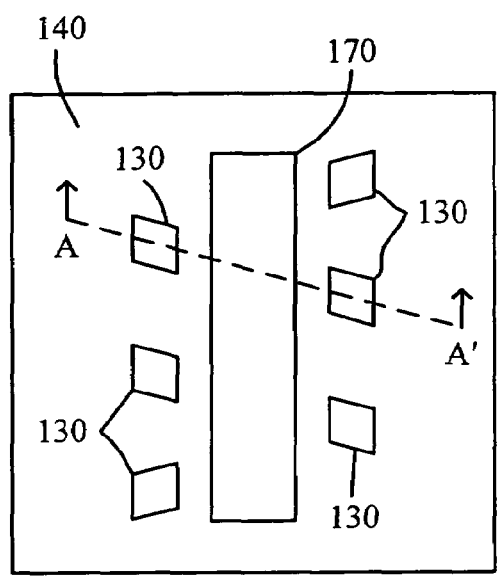
Figure 7A:
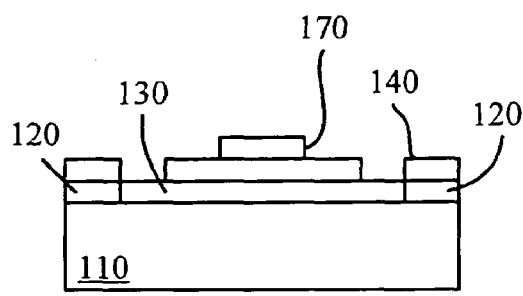

As illustrated in FIGS. 7 and 7A, exposed portions of magnetic material 150 and patterned resist layer 160 may be removed. Exposed portion of magnetic material 150 may be removed by any available technique, such as wet etch or dry etch. Patterned resist layer 160 may be removed by any available technique, such as ash and wet etch.

In some embodiments, a protective coat (not shown) may be formed over magnetic core 170. In an embodiment, the protective coat may include polyimide and be formed by spin on, expose, and develop. In an embodiment, the protective coat may be formed over magnetic core 170 and portions of separation layer 140.

With reference to FIG. 4, FIGS. 8-10 may illustrate another method for forming magnetic core 170.

As illustrated in FIGS. 8 and 8A, a pattern layer 180 may be formed over layer 120, pattern 130, and separation layer 140. In an embodiment, pattern layer 180 may include a pattern including openings that expose a portion of separation layer 140. In an embodiment, pattern layer 180 may be formed by known techniques such as spin-on, exposure, and develop. In some embodiments, pattern layer 180 may include a resist.

As illustrated in FIGS. 9 and 9A, a magnetic material 190 may be formed. Magnetic material 190 may be formed by any available technique. In an embodiment, magnetic material 190 may be selectively formed in the openings of pattern layer 180. In other embodiments, magnetic material 190, may be formed in the openings of pattern layer 180 and over portions of pattern layer 180 (not shown). In some embodiments, magnetic material may be formed by methods including plating, electroless plating, and sputter. Magnetic material 190 may include any suitable material. In some embodiments, magnetic material 190 may include permalloys. In other embodiments, magnetic material 190 may include NiFe, FeTaN, or NiFeRe. In an embodiment, magnetic material 190 may include CoZrTa.

The thickness of magnetic material 190 illustrated in FIGS. 9 and 9A may be any desired thickness. In some embodiments, the thickness of magnetic material 190 may be chosen based on a desired magnetic permeability of magnetic core 170. In an embodiment, the thickness may be in the range of about 0.25 to 10 microns. In another embodiment, the thickness may be in the range of about 0.25 to 5 microns. In another embodiment, the thickness may be it the range of about 0.5 to 2 microns.

Figure 10:
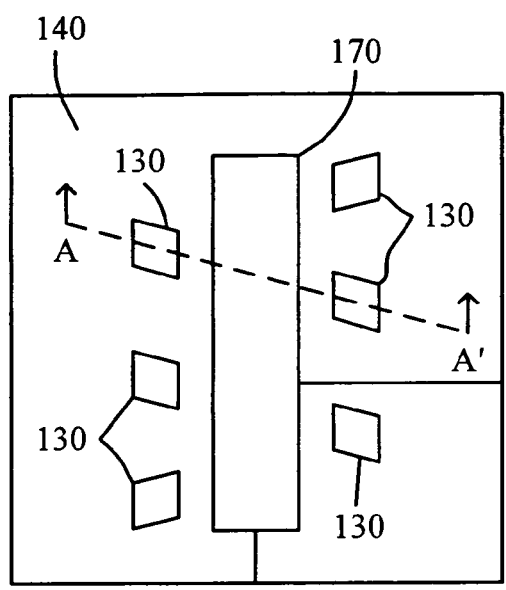
Figure 10A:
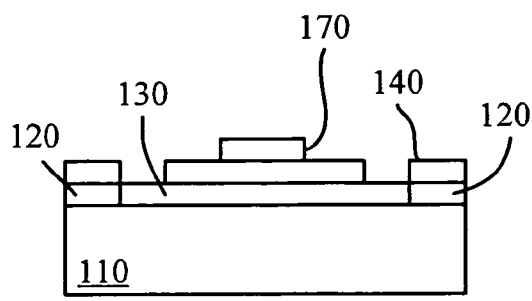

As illustrated in FIGS. 10 and 10A, pattern layer 180 may be removed. Pattern layer 180 may be removed by any suitable technique. In an embodiment, removal of pattern layer 180 may provide for removal of portions of magnetic material 190 by a lift off technique. That is, any magnetic material 190 that was situated over pattern layer 180 may be removed during the removal of pattern layer 180.

In some embodiments, a protective coat (not shown) may be formed over magnetic core 170. In an embodiment, the protective coat may include polyimide and be formed by spin on, expose, and develop. In an embodiment, the protective coat may be formed over magnetic core 170 and portions of separation layer 140.

As previously mentioned, FIGS. 7 and 10 are substantially the same. With reference, then, to either FIG. 7 or FIG. 10, FIGS. 11-17 illustrate a method for forming high performance integrated inductors.

As illustrated in FIGS. 11 and 11A, a column 200 may be formed over a portion of separation layer 140 and magnetic core 170. Column 200 may be formed by any suitable technique. In some embodiments, column 200 may be formed by spin on, expose, and develop. In an embodiment, column 200 may include a resist. In another embodiment, column 200 may include a polymer. In some embodiments, column 200 may have a width wider than magnetic core 170. In an embodiment, column 200 may have an aspect ratio of about 1:1.

As illustrated in FIGS. 12 and 12A, a dome 210 may be formed from column 200. In an embodiment, dome 210 may be formed by reflowing column 200 with solvents. In another embodiment, dome 210 may be formed by baking column 200. In an embodiment, dome 210 may be formed by baking column 200 at a temperature in the range of about 100 to 120° C. for a time in the range of about 15 to 45 minutes. In another embodiment, dome 210 may be formed by multiple baking steps. In an embodiment, a first bake at a temperature in the range of about 100 to 120° C. for a time in the range of about 15 to 45 minutes and a second bake at a temperature in the range of about 100 to 150° C. for a time in the range of about 15 to 45 minutes may be used to form dome 210.

Figure 13:
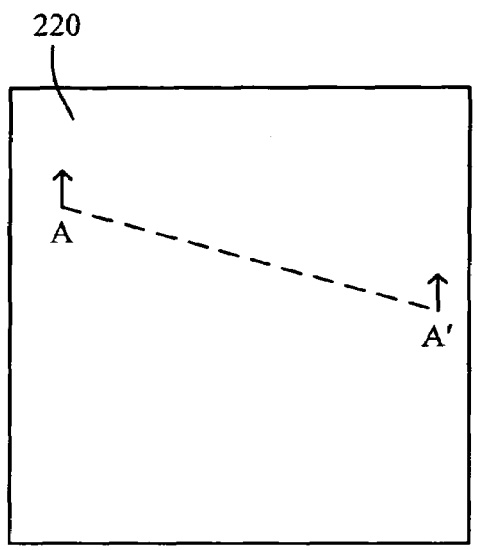
Figure 13A:
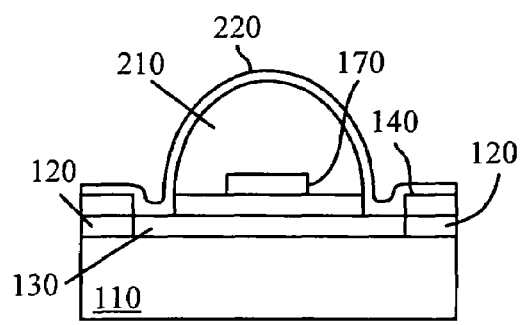

As illustrated in FIGS. 13 and 13A, a layer 220 may be formed over pattern 130, separation layer 140, and dome 210. Layer 220 may be formed by any available technique and may be any suitable material. In an embodiment, layer 220 may provide a seed layer for subsequent metal formation, as is discussed below. In some embodiments, layer 220 may include a metal. In an embodiment, layer 220 may be formed by sputtering. In an embodiment, layer 220 may include copper. In another embodiment, layer 220 may have a thickness in the range of about 500 to 2,000 Å. In some embodiments, layer 220 may not be required.

Figure 14:
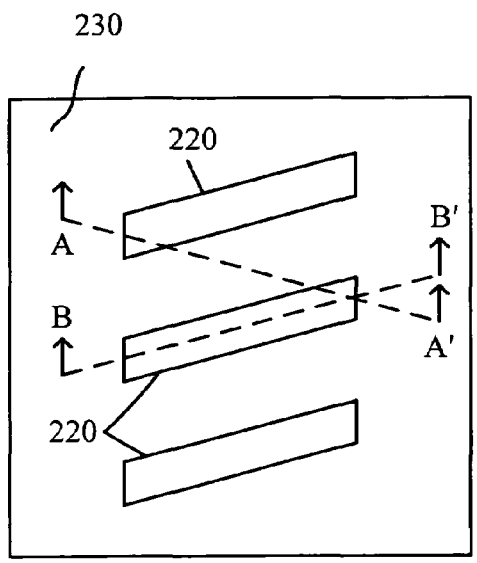
Figure 14A:
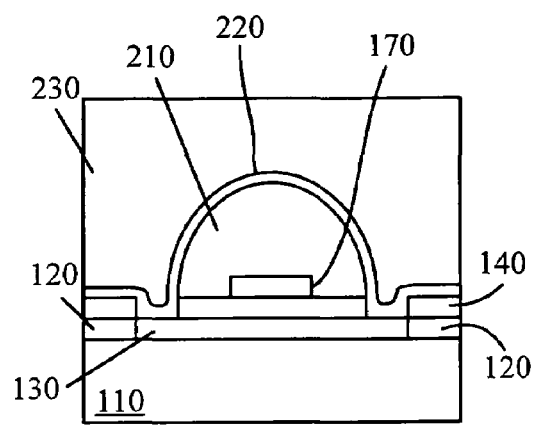
Figure 14B:
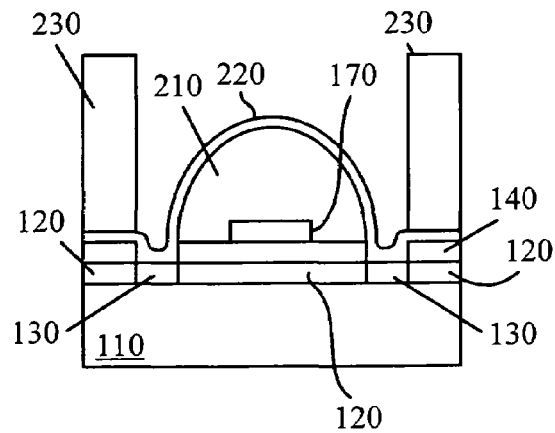

As illustrated in FIGS. 14, 14A, and 14B, a pattern 230 may be formed over layer 220. FIG. 14B illustrates a cross sectional view taken between points B and B'. Pattern 230 may include openings that define elements 102 of inductor 100 illustrated in FIGS. 1 and 2. Pattern 230 may include any suitable material. In an embodiment, pattern 230 may include a thick photosensitive material. In another embodiment, pattern 230 may include a positive resist.

Figure 15:
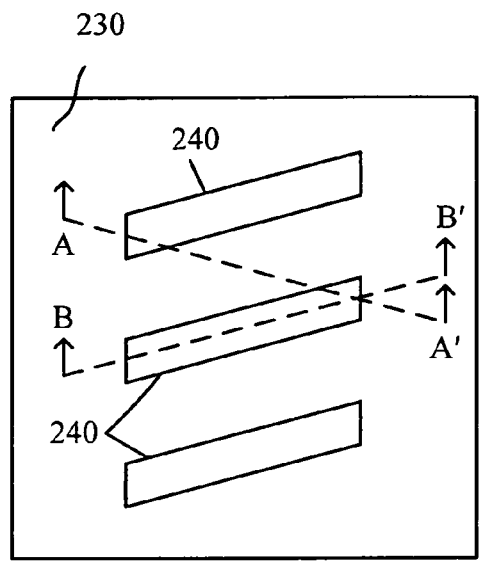
Figure 15A:
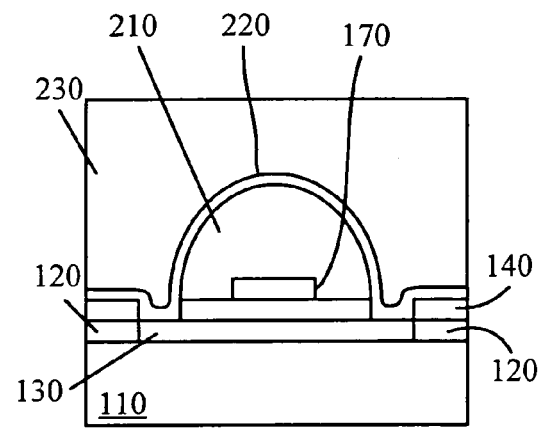
Figure 15B:
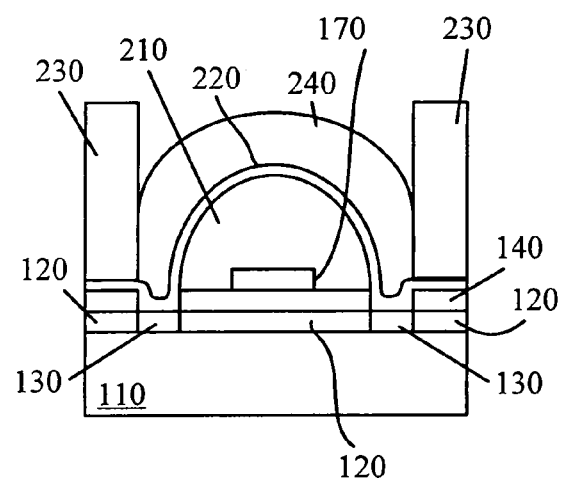

As illustrated in FIGS. 15, 15A, and 15B, a conductor 240 may be formed in the openings of pattern 230. Conductor 240 may form part of elements 102 of inductor 100 illustrated in FIGS. 1 and 2. Conductor 240 may be formed by any suitable technique. In an embodiment, conductor 240 may be formed by a conformal plating technique. In some embodiments, forming conductor 240 may include electroplating, electroless plating, chemical vapor deposition (CVD), or physical vapor deposition (PVD). Conductor 240 may be any suitable material. In some embodiments, conductor 240 may include a metal. In an embodiment, conductor 240 may include copper. In an embodiment, conductor 240 may include aluminum. In another embodiment, conductor 240 may include gold. Any thickness of conductor 240 may be used. The thickness of conductor 240 may be chosen based on an electrical DC resistance of inductor 100. In some embodiments, the thickness may be chosen such that inductor 100 has a resistance in the range of about 0.02 to 0.2 Ohms.

As illustrated in FIGS. 15, conductor 240 may be in the shape of an arc. However, other shapes may be available. In an embodiment, column 200 may be used as a support for conductor 240. Therefore, dome 210, column 200, or other shapes may be used to support conductor 240 and they may be referred to generally as a support.

As illustrated in FIG. 15B, in some embodiments, the thickness of conductor 240 may be substantially larger than the thickness of layer 220. In an embodiment, the thickness of conductor 240 may be in the range of about 20 to 50 microns. In another embodiment, the thickness of conductor 240 may be in the range of about 25 to 35 microns.

Figure 16:
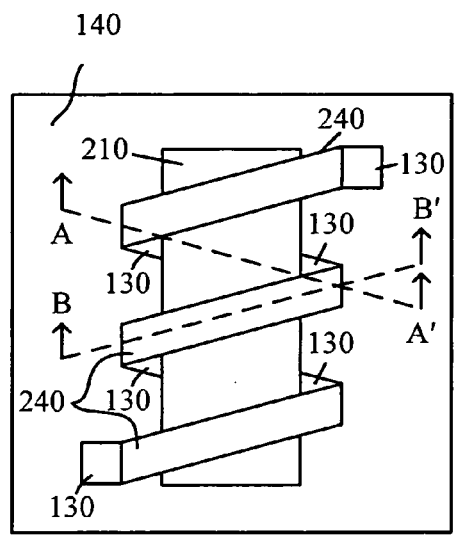
Figure 16A:
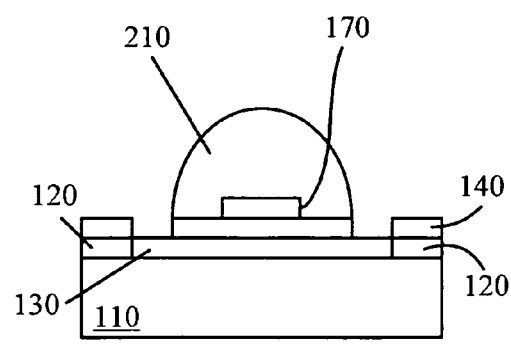
Figure 16B:
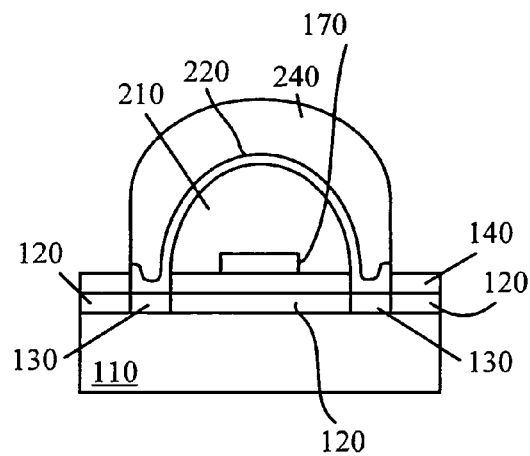

As illustrated in FIGS. 16, 16A, and 16B, pattern 230 may be removed by any available technique. Also, as illustrated in FIGS. 16, 16A, and 16B, portions of layer 220 may be removed. In an embodiment, portions of layer 220 may be removed by a blanket etch. In some embodiments, part of conductor 240 may be removed during a blanket etch that removes entire portions of layer 220.

Figure 17:
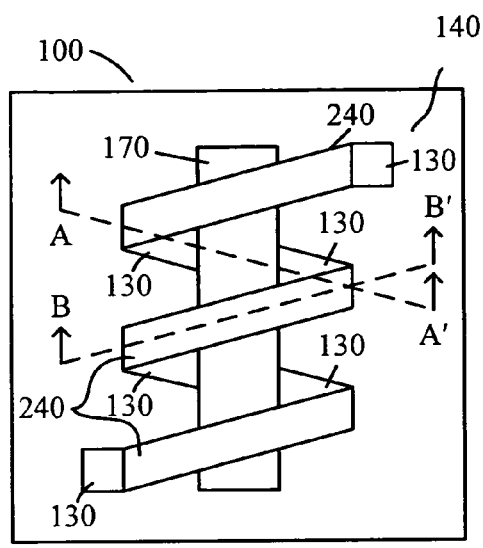
Figure 17A:
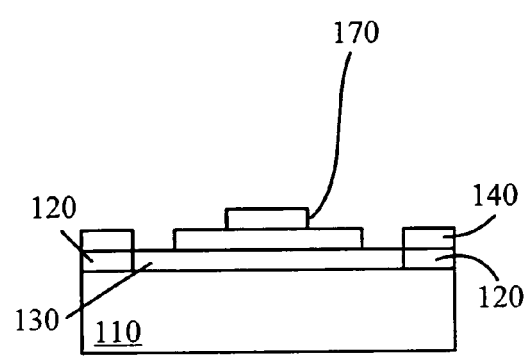
Figure 17B:
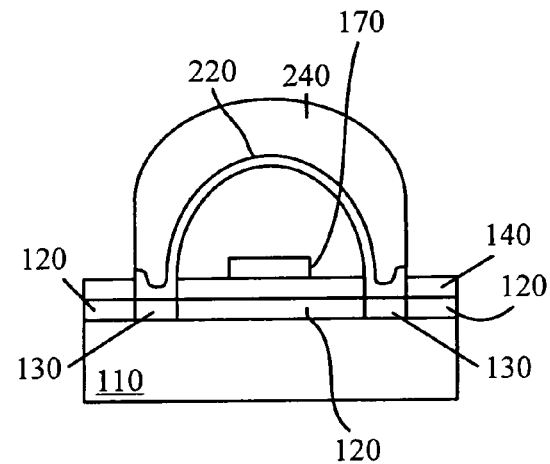

As illustrated in FIGS. 17, 17A, and 17B, dome 210 may be removed by any suitable technique. In some embodiments, dome 210 may be removed by a stripping technique.

With reference to FIGS. 4 and 4A, a method in accordance with another embodiment is illustrated in FIGS. 18-28. FIGS. 18 and 4 may be substantially the same.

As illustrated in FIGS. 19 and 19A, a dome 250 may be formed on portions of separation layer 140. Dome 250 may be formed by any available technique. In an embodiment, a column may be formed and the column may be reflowed or baked into a dome. In some embodiments, the column may be formed by spin on, expose and develop. In an embodiment, the column may include a resist. In another embodiment, the column may include a polymer. In an embodiment, the column may have an aspect ratio that is about 1:1.

In an embodiment, dome 250 may be formed by reflowing the column with solvents. In an embodiment, dome 250 may be formed by baking the column. In another embodiment, dome 250 may be formed by baking the column at a temperature in the range of about 100 to 120° C. for a time in the range of about 15 to 45 minutes. In another embodiment, dome 250 may be formed by multiple baking steps. In an embodiment, a first bake at a temperature in the range of about 100 to 120° C. for a time in the range of about 15 to 45 minutes and a second bake at a temperature in the range of about 100 to 150° C. for a time in the range of about 15 to 45 minutes may be used to form dome 250.

Figure 20:
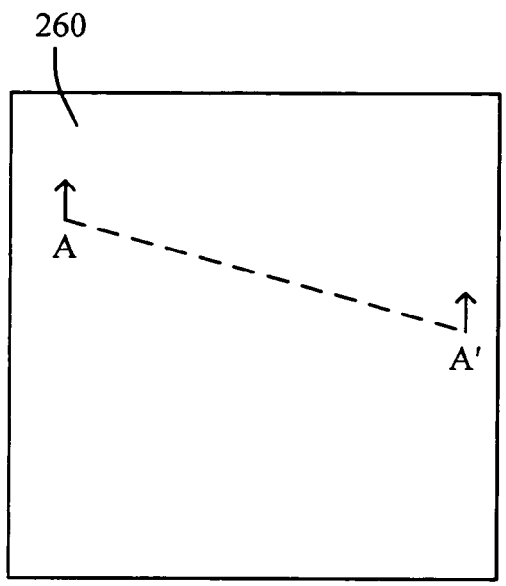
Figure 20A:
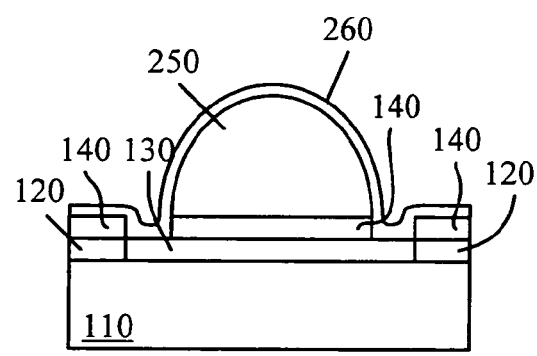

As illustrated in FIGS. 20 and 20A, a layer 260 may be formed over pattern 130, separation layer 140, and dome 250. Layer 260 may be formed by any available technique and may be any suitable material. In an embodiment, layer 260 may provide a seed layer for subsequent metal formation, as is further discussed below. In an embodiment, layer 260 may be formed by sputtering. In some embodiments, layer 260 may include a metal. In an embodiment, layer 260 may include copper. In an embodiment, layer 260 may have a thickness in the range of about 500 to 2,000 Å. In some embodiments, layer 260 may not be required.

Figure 21:
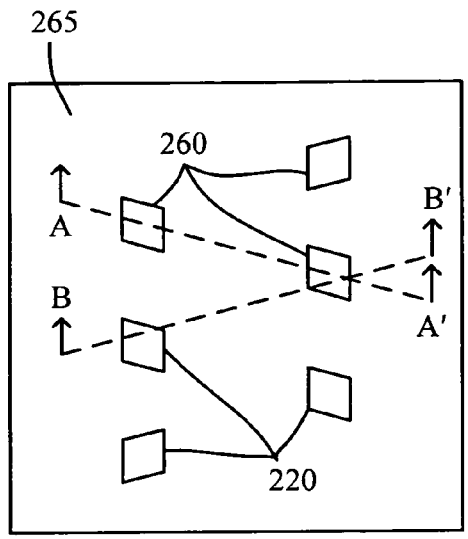
Figure 21A:
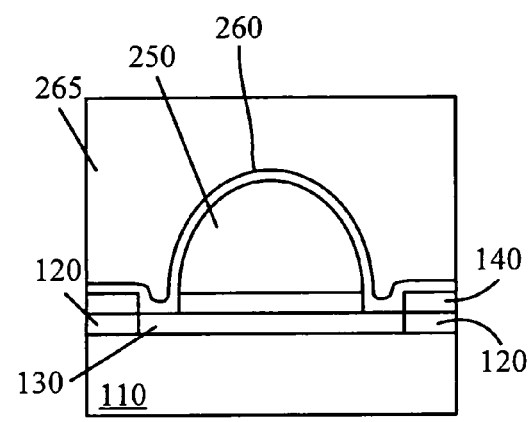
Figure 21B:
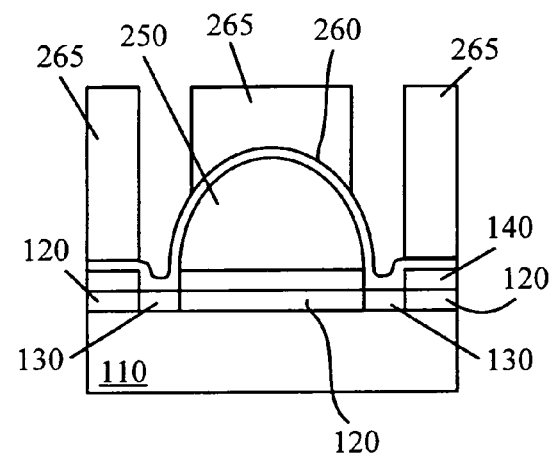

As illustrated in FIGS. 21, 21A, and 21B, a pattern 265 may be formed over layer 260. Pattern 265 may include openings that define portions of elements 102 of inductor 100 illustrated in FIGS. 1 and 2. Pattern 265 may include any suitable material. In an embodiment, pattern 265 may include a thick photosensitive material. In another embodiment, pattern 265 may include a positive resist. Pattern 265 may be formed by any available technique. In an embodiment, pattern 265 may be formed by spin on, expose, and develop.

Figure 22:
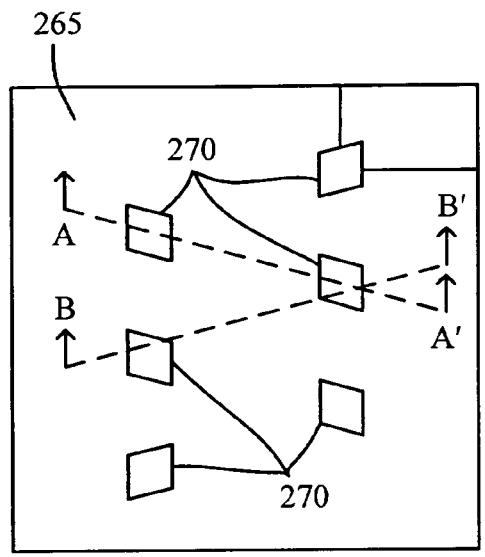
Figure 22A:
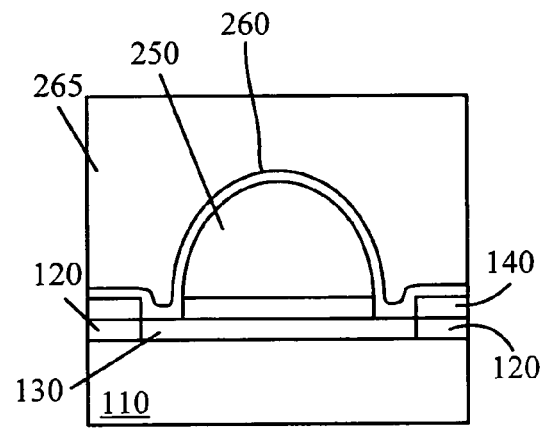
Figure 22B:
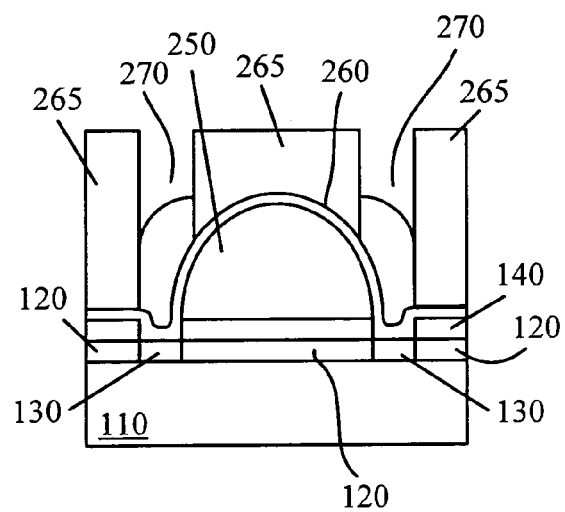

As illustrated in FIGS. 22, 22A, and 22B, a conductor 270 may be formed in the openings of pattern 265. Conductor 270 may be formed by any available means. In an embodiment, conductor 270 may be formed by a conformal plating technique. In some embodiments, forming conductor 270 may include electroplating, electroless plating, chemical vapor deposition (CVD), or physical vapor deposition (PVD). Conductor 270 may be any suitable material. In an embodiment, conductor 270 may include a metal. In another embodiment, conductor 270 may include copper. In an embodiment, conductor 270 may include aluminum. In another embodiment, conductor 270 may include gold. As shown in FIG. 22B, conductor 270 may be formed in an opening that define portions of elements 102, while covering portions along the centerline of inductor 100.

Figure 23:
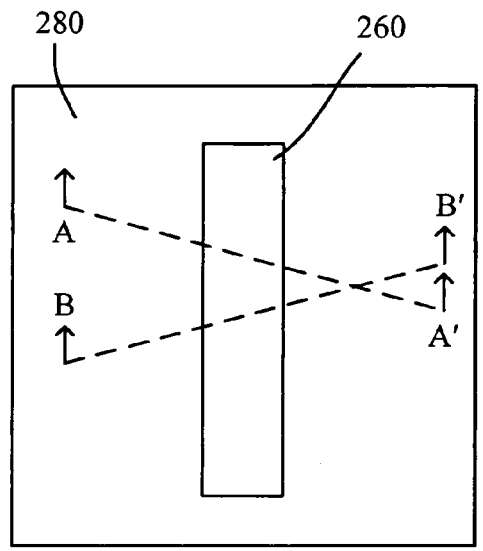
Figure 23A:
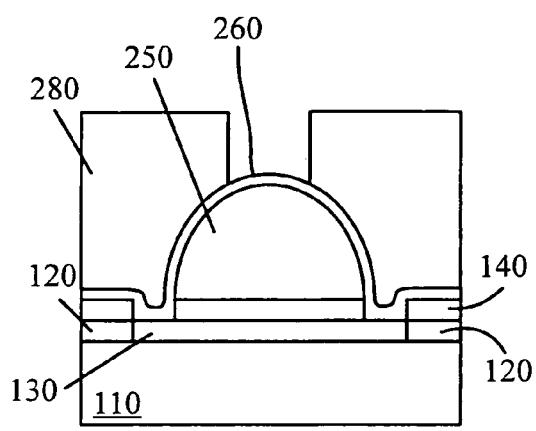
Figure 23B:
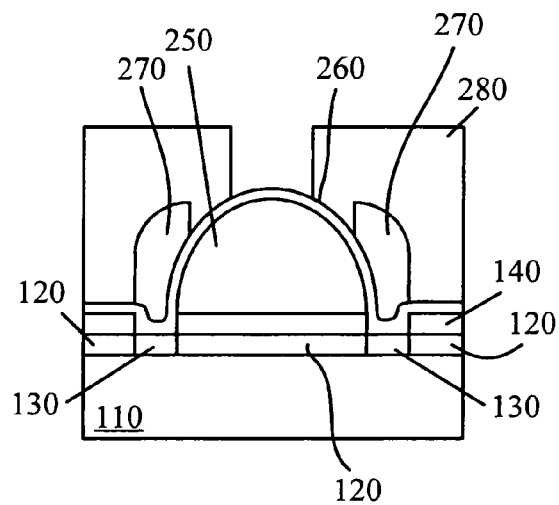

As illustrated in FIGS. 23, 23A, and 23B, pattern 265 may be stripped by any available means and a pattern 280 may be formed over layer 260 and conductor 270. Pattern 280 may include openings that define locations for a magnetic core, as is further discussed below. Pattern 280 may include any suitable material. In an embodiment, pattern 280 may include a resist. Pattern 280 may be formed by any available technique. In an embodiment, pattern 280 may be formed by spin on, expose, and develop.

Figure 24:
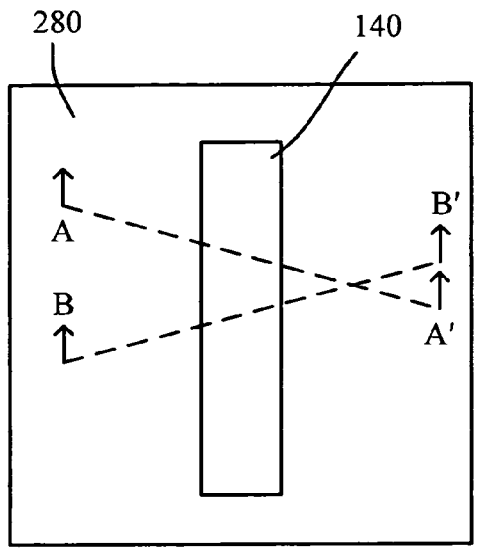
Figure 24A:
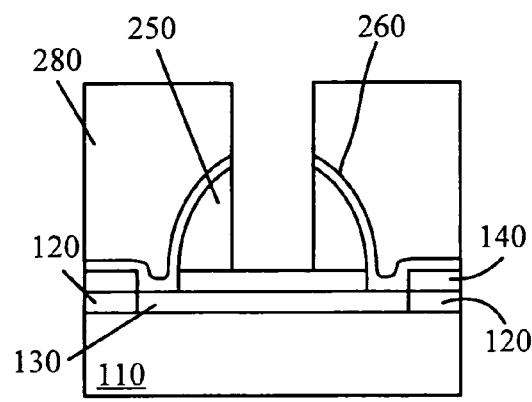
Figure 24B:
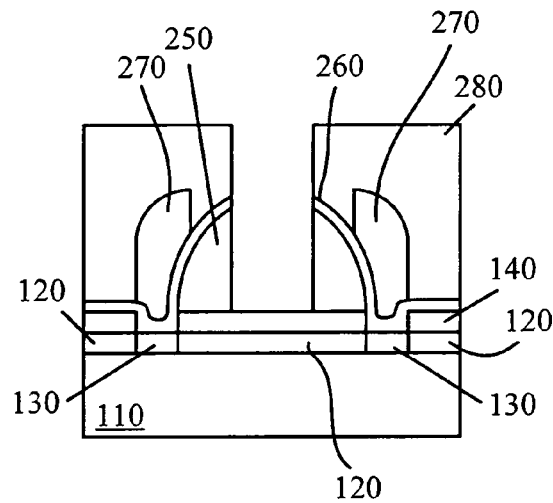

As illustrated in FIGS. 24, 24A, and 24B, portions of layer 260 and dome 250 may removed. Portions of layer 260 may be removed by any available technique such as wet etch or dry etch. Portions of dome 250 may also be removed by any available technique such as wet etch or dry etch. In an embodiment, different techniques may be used for the removal of portions of layer 260 and dome 250. Removal of portions of layer 260 and dome 250 may expose portions of separation layer 140.

Figure 25:
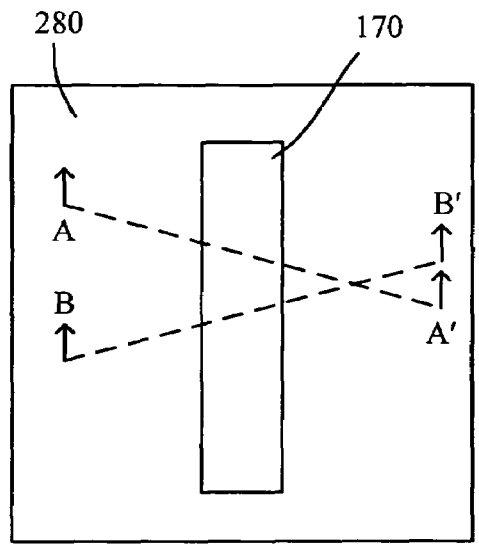
Figure 25A:
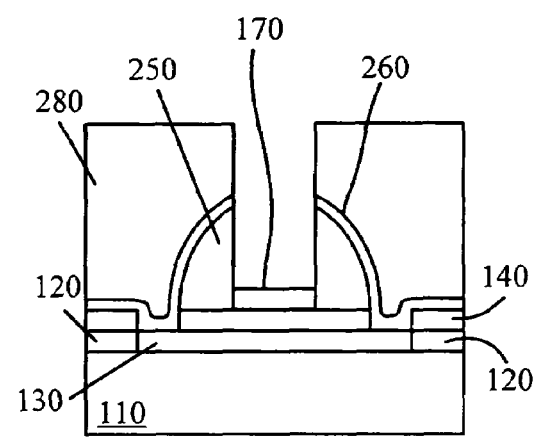
Figure 25B:
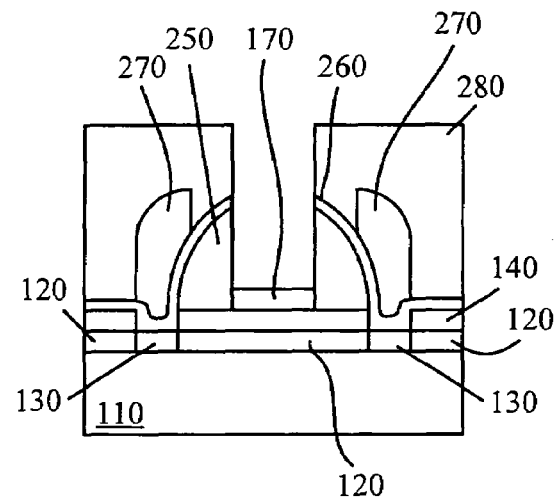

As illustrated in FIGS. 25, 25A, and 25B, a magnetic core 170 may be formed on separation layer 140. Magnetic core 170 may be formed by known techniques, such as deposition, sputtering, and plating. Magnetic core 170 may include any suitable material. In some embodiments, magnetic core 170 may include permalloys. In other embodiments, magnetic core 170 may include NiFe, FeTaN, or NiFeRe. In an embodiment, magnetic core 170 may include CoZrTa.

The thickness of magnetic core 170 illustrated in FIGS. 25, 25A, and 25B may be any desired thickness. In some embodiments, the thickness of magnetic core 170 may be chosen based on a desired magnetic permeability of magnetic core 170. In an embodiment, the thickness may be in the range of about 0.25 to 10 microns. In another embodiment, the thickness may be in the range of about 0.25 to 5 microns. In another embodiment, the thickness may be it the range of about 0.5 to 2 microns.

Figure 26:
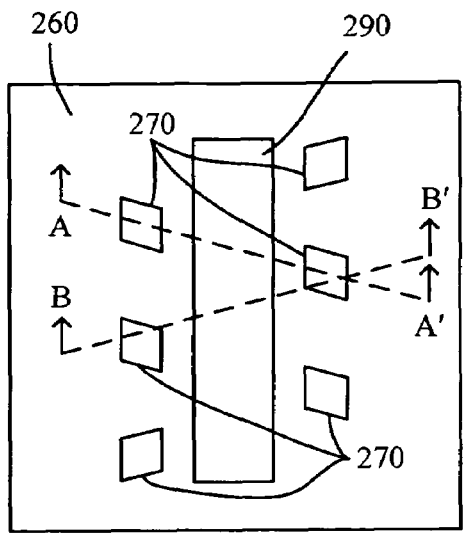
Figure 26A:
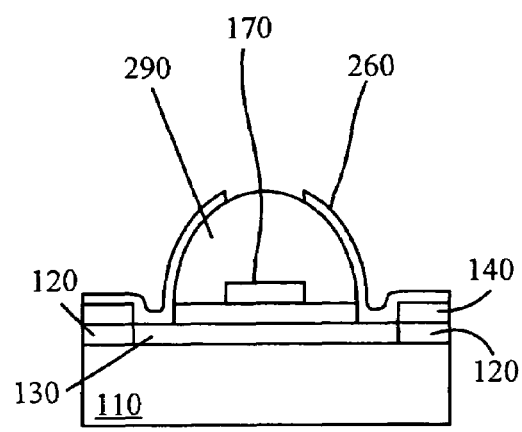
Figure 26B:
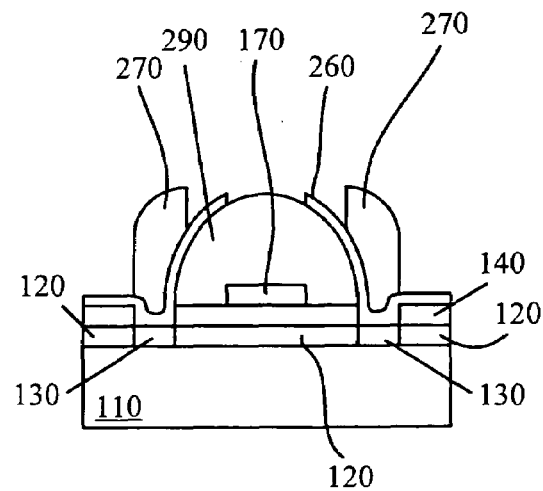

As illustrated in FIGS. 26, 26A, and 26B, pattern 280 and dome 250 may be removed and dome 290 may be formed. Pattern 280 may be removed by any available technique, such as wet etch, dry etch or stripping. Dome 250 may also be removed by any available technique, such as wet etch, dry etch or stripping. In some embodiments, a protective coat (not shown) may be formed over magnetic core 170. In an embodiment, the protective coat may include polyimide and may be formed by spin on, expose, and develop.

Dome 290 may be formed by any available technique. In an embodiment, a column may be formed and the column may be reflowed or baked into a dome. In some embodiments, the column may be formed by spin on, expose and develop. In an embodiment, the column may include a resist. In another embodiment, the column may include a polymer. In an embodiment, the column may have an aspect ratio that is about 1:1. In an embodiment, dome 290 may be formed by reflowing the column with solvents. In an embodiment, dome 290 may be formed by baking the column. In another embodiment, dome 290 may be formed by baking the column at a temperature in the range of about 100 to 120° C. for a time in the range of about 15 to 45 minutes. In another embodiment, dome 290 may be formed by multiple baking steps. In an embodiment, a first bake at a temperature in the range of about 100 to 120° C. for a time in the range of about 15 to 45 minutes and a second bake at a temperature in the range of about 100 to 150° C. for a time in the range of about 15 to 45 minutes may be used to form dome 290.

Figure 27:
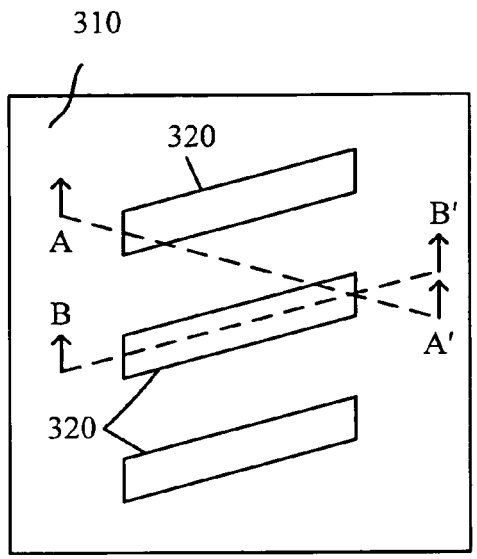
Figure 27A:
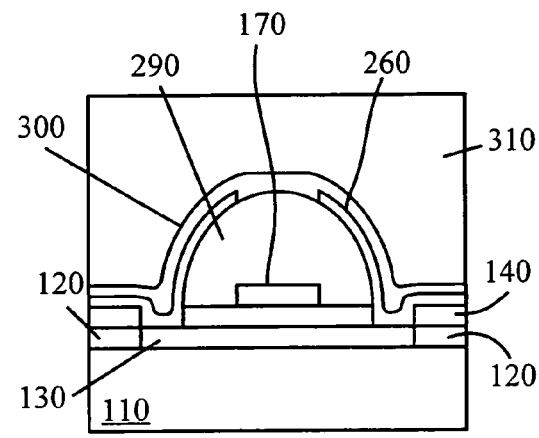
Figure 27B:
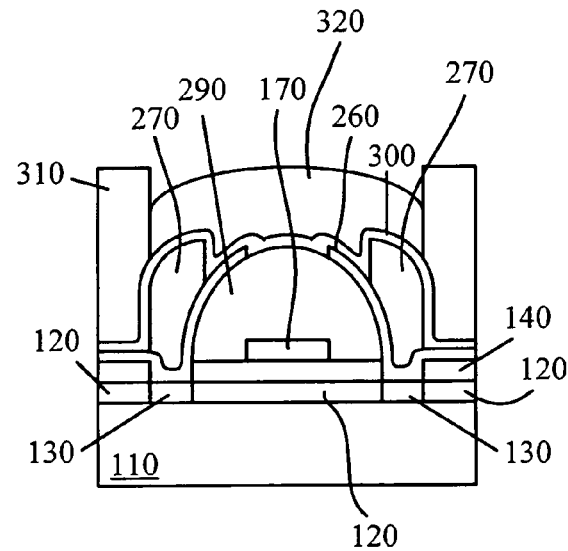

As illustrated in FIGS. 27, 27A, and 27B, a layer 300, a pattern 310, and a conductor 320 may be formed. Layer 300 may be formed over layer 260, conductor 270, and dome 290. Layer 300 may be formed by any available technique and may be any suitable material. In an embodiment, layer 300 may provide a seed layer for subsequent metal formation, as is further discussed below. In an embodiment, layer 300 may be formed by sputtering. In some embodiments, layer 300 may include a metal. In an embodiment, layer 300 may include copper. In another embodiment, layer 300 may have a thickness in the range of about 500 to 2,000 Å. In some embodiments, layer 300 may not be required.

Pattern 310 may be formed over layer 300. Pattern. 310 may include openings that define portions of elements 102 of inductor 100 illustrated in FIGS. 1 and 2. Pattern 310 may include any suitable material. In an embodiment, pattern 310 may include a thick photosensitive material. In another embodiment, pattern 310 may include a positive resist. Pattern 310 may be formed by any available technique. In an embodiment, pattern 310 may be formed by spin on, expose, and develop.

Conductor 320 may be formed in the openings of pattern 310. Conductor 320 may be formed by any available means. In an embodiment, conductor 320 may be formed by a conformal plating technique. In some embodiments, forming conductor 320 may include electroplating, electroless plating, chemical vapor deposition (CVD), or physical vapor deposition (PVD). Conductor 320 may be any suitable material. In an embodiment, conductor 320 may include a metal. In another embodiment, conductor 320 may include copper. In an embodiment, conductor 320 may include aluminum. In another embodiment, conductor 320 may include gold. As shown in FIG. 27B, conductor 320 may be formed in an opening that define portions of elements 102, forming the remainder of elements 102. Any thickness of conductor 320 may be used. The thickness of conductor 320 may be chosen based on an electrical DC resistance of inductor 100. In some embodiments, the thickness may be chosen such that inductor 100 has a resistance in the range of about 0.02 to 0.2 Ohms.

Figure 28:
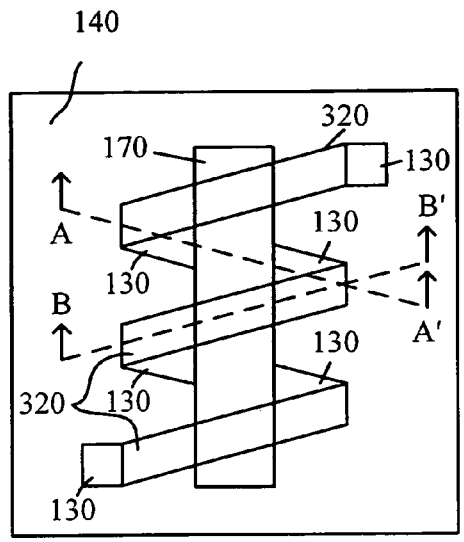
Figure 28A:
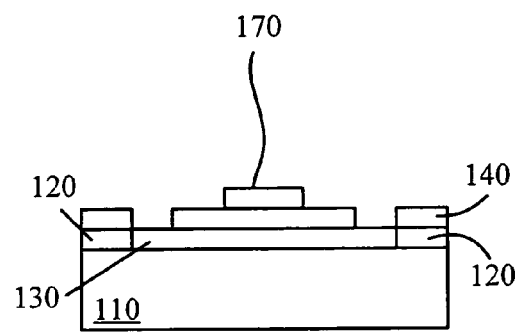
Figure 28B:
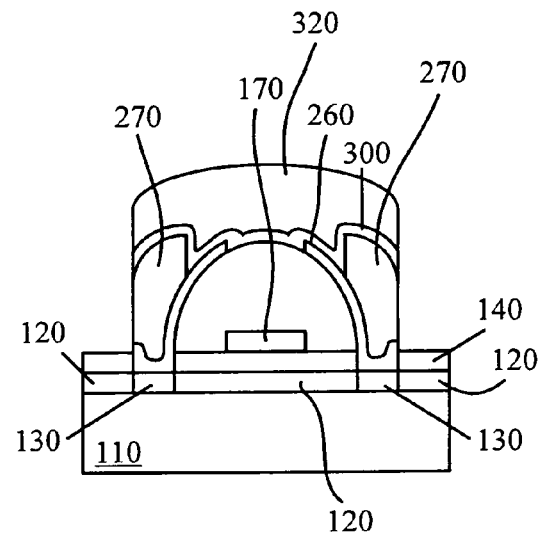

As illustrated in FIGS. 28, 28A, and 28B, pattern 310 may be removed, portions of layers 260, 300 may be removed, and dome 290 may be removed. Pattern 310 may be removed by any available technique such as an etch process. Portions of layers 260, 300 may also be removed by any available technique. In an embodiment, portions of layers 260, 300 may be removed by a blanket etch. In some embodiments, part of conductor 320 may be removed during a blanket etch that removes entire portions of layers 260, 300.

Dome 290 may be removed by any suitable technique. In some embodiments, dome 290 may be removed by a stripping technique.

In some embodiments, inductor 100 may be integrated with a semiconductor device. In an embodiment the semiconductor device may be a microprocessor. In other embodiments, the semiconductor device may be a memory controller hub, input/output (I/O) controller hub, graphics processor, display processor, network processor, or network interface component. In yet other embodiments, the semiconductor device may be a volatile memory component such as a dynamic random access memory or a static random access memory.

Figure 29:
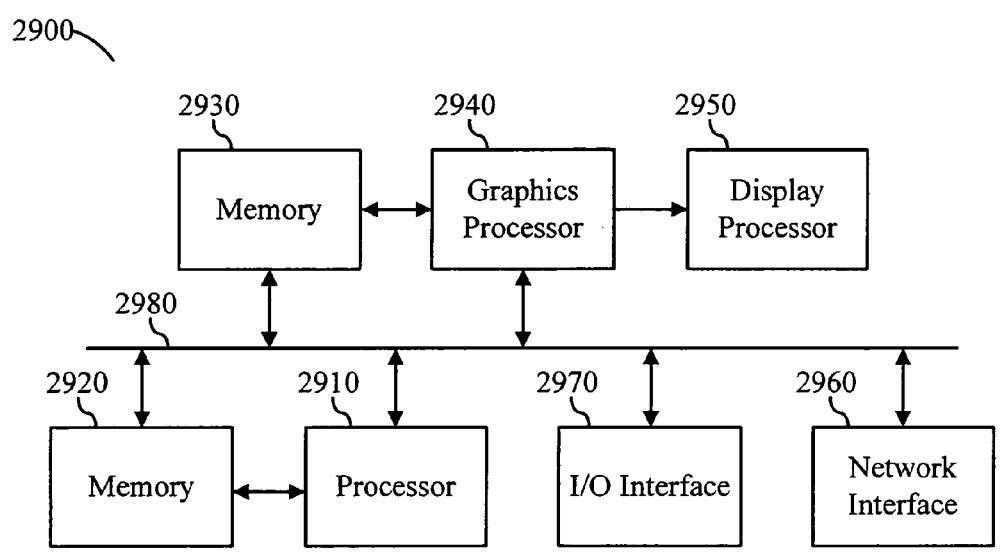
FIG. 29 illustrates a schematic of a system in accordance with one embodiment of the present invention.

As illustrated in FIG. 29, inductor 100 may be incorporated into a system 2900. System 2900 may include a processor 2910, a memory 2920, a memory 2930, a graphics processor 2940, a display processor 2950, a network interface 2960, an I/O interface 2970, and a communication bus 2980. Any of the components in system 2900 may include inductor 100. In an embodiment, processor 2910 may include inductor 100. In another embodiment, graphics processor 2940 may include inductor 100. A large number of combinations of components including inductor 100 may be available.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of forming an integrated inductor comprising:
    forming a pattern over a conductive pattern on a substrate;
    forming a magnetic core over the pattern;
    forming a support over the magnetic core;
    forming a second pattern including openings over the support;
    depositing a conductor in the openings; and
    removing the second pattern and the support.

2. The method of claim 1, wherein forming the magnetic core includes depositing magnetic material, patterning a resist layer over the magnetic material, etching exposed magnetic material, and removing the resist layer.

3. The method of claim 1, wherein forming the magnetic core includes patterning a resist layer, depositing magnetic material over the resist layer, and removing the resist layer.

4. The method of claim 1, further comprising:
    forming a protective coating over the magnetic core.

5. The method of claim 1, wherein forming the support includes forming a column over the magnetic core and baking the column to form a dome.

6. The method of claim 1, wherein forming the support includes forming a column over the magnetic core and reflowing the column into a dome.

7. The method of claim 6, wherein the column has an aspect ratio of approximately 1:1.

8. The method of claim 1, wherein the support has a width greater than a width of the magnetic core.

9. The method of claim 1, wherein forming the second pattern includes patterning a photosensitive material.

10. The method of claim 1, further comprising:
    forming a seed layer over the dome and a portion of the metal pattern.

11. The method of claim 10, wherein the seed layer comprises copper.

12. The method of claim 10, wherein depositing the metal includes electroplating.

13. The method of claim 10, further comprising:
    removing a portion of the seed layer.

14. The method of claim 1, wherein the conductor comprises at least one of copper, aluminum, or gold.

15. The method of claim 1, further comprising:
    forming a second dome over the pattern;
    forming a seed layer over the second dome;
    forming a third pattern including openings over the barrier layer;
    depositing a second metal into the openings of the third pattern;
    removing the third pattern;
    forming a fourth pattern including openings over the barrier layer;
    etching portions of the seed layer and the second dome to expose the pattern; and
    removing the second dome.

16. A method of forming an integrated inductor comprising:
    forming a pattern over a metal pattern on a substrate;
    forming a magnetic core over the pattern;
    forming a dome over the magnetic core;
    depositing a seed layer over the dome and a portion of the metal pattern;
    forming a second pattern including openings over the dome;
    depositing a metal on the seed layer in the openings; and
    removing the second pattern, a portion of the seed layer, and the dome to form an inductor.

17. The method of claim 16, wherein forming the dome includes patterning resist to form a column over the magnetic core and reflowing the column.

18. The method of claim 16, wherein forming the dome includes patterning resist to form a column over the magnetic core and baking the column.

19. The method of claim 16, wherein forming the magnetic core includes depositing magnetic material, patterning a resist layer over the magnetic material, etching exposed magnetic material, and removing the resist layer.

20. The method of claim 16, wherein forming the magnetic core includes patterning a resist layer, depositing magnetic material over the resist layer, and removing the resist layer.

21. The method of claim 16, further comprising:
forming a second dome over the pattern;
forming a second seed layer over the second dome;
forming a third pattern including openings over the barrier layer;
depositing a second metal into the openings of the third pattern;
removing the third pattern;
forming a fourth pattern including openings over the barrier layer;
etching the barrier layer and the second dome to expose the pattern; and
removing the fourth pattern and the second dome.

* * * * *